United States Patent [19]

Bozler et al.

[11] 4,248,675
[45] Feb. 3, 1981

[54] METHOD OF FORMING ELECTRICAL CONTACT AND ANTIREFLECTION LAYER ON SOLAR CELLS

[75] Inventors: Carl O. Bozler, Sudbury; Ralph L. Chapman, Winchester; John C. C. Fan, Chestnut Hill; Robert W. McClelland, Weymouth, all of Mass.

[73] Assignee: Massachusetts Institute of Technology, Cambridge, Mass.

[21] Appl. No.: 124,083

[22] Filed: Feb. 25, 1980

Related U.S. Application Data

[60] Division of Ser. No. 22,405, Mar. 21, 1979, which is a continuation-in-part of Ser. No. 889,078, Mar. 22, 1978, abandoned.

[51] Int. Cl.$^3$ .................................... H01L 31/04
[52] U.S. Cl. ...................... 204/38 A; 136/256; 136/262; 204/56 R; 357/30
[58] Field of Search .................. 204/38 A, 56 R; 139/89 CC, 89 GA; 357/30

[56] References Cited

U.S. PATENT DOCUMENTS

3,982,265  9/1976  Johnston, Jr. .................... 357/30
4,133,724  1/1979  Hartnagel et al. ................ 204/38 A

OTHER PUBLICATIONS

H. J. Hovel et al., "High-Efficiency $Ga_{1-x}Al_xAs$–GaAs Solar Cells", *IBM Tech. Disc. Bull.*, vol. 19, pp. 2289 (1976).
H. J. Hovel et al., "Anodized GaAs Solar Cells", *IBM Tech. Disc. Bull.*, vol. 19, pp. 2808 (1976).
H. J. Hovel et al., "Improved GaAs Solar Cells With Very Thin Junctions", *Conf. Record, 12th IEEE Photovoltaic Specialists Conf.* (1976), pp. 945–947.
W. D. Johnston, Jr. et al., "High-Performance Solar Cell Material: n-AlAs/p-GaAs Prepared By Vapor Phase Epitaxy", *Appl. Phys. Lett.*, vol. 28, pp. 150–152 (1976).

*Primary Examiner*—Aaron Weisstuch
*Attorney, Agent, or Firm*—Arthur A. Smith, Jr.; David E. Brook

[57] ABSTRACT

A method of applying an electrical contact and an anodic reflection coating to an n+ layer of a direct gap semiconductor device, comprising applying an anodizable metal contact to the n+ layer and thereafter anodizing the n+ layer whereby its thickness is reduced and an antireflection layer is formed thereover.

2 Claims, 17 Drawing Figures

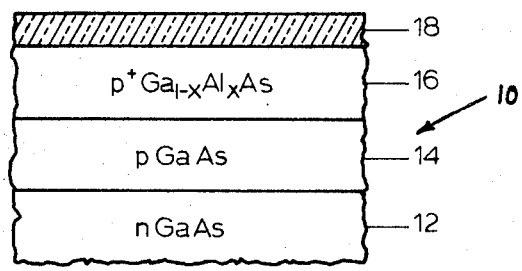
Fig-1-
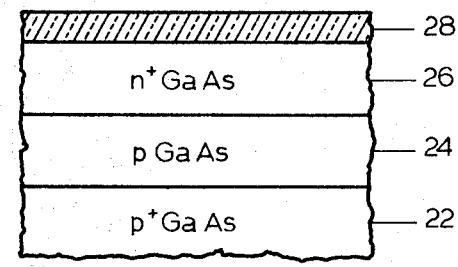
Fig-2-
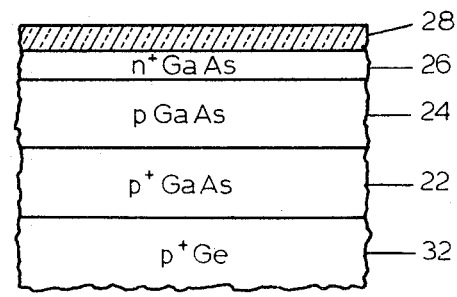
Fig-3-

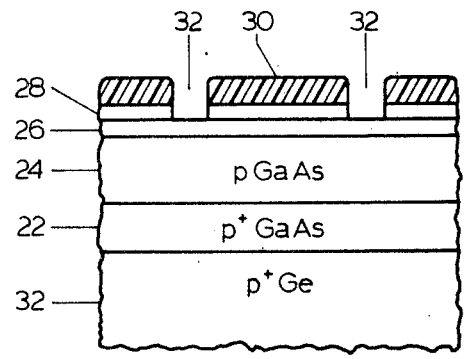
Fig-4a-
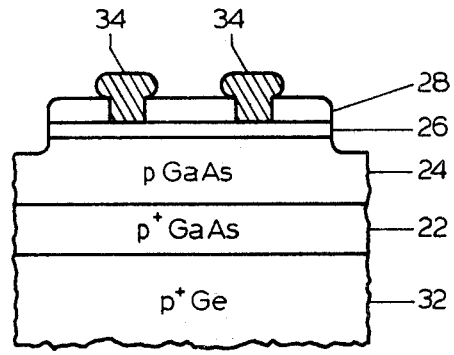
Fig-4b-
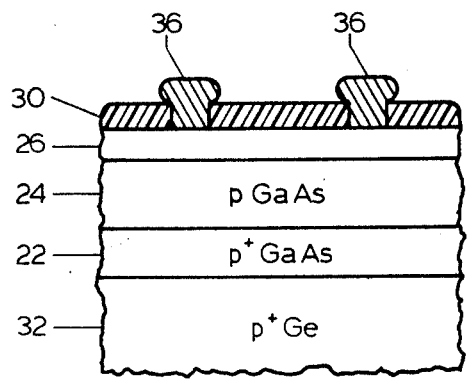
Fig-5a-
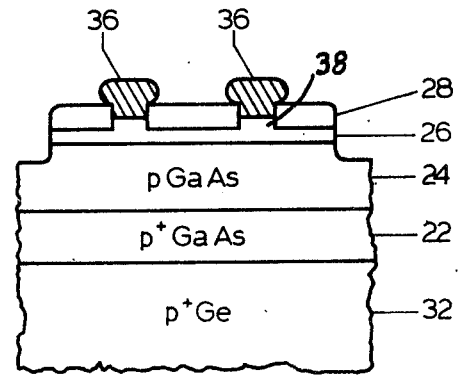
Fig-5b-
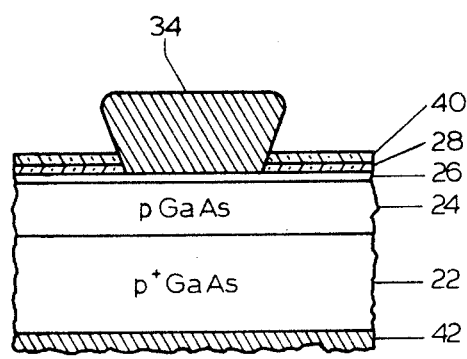
Fig-6-

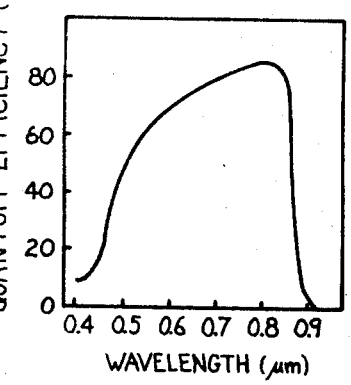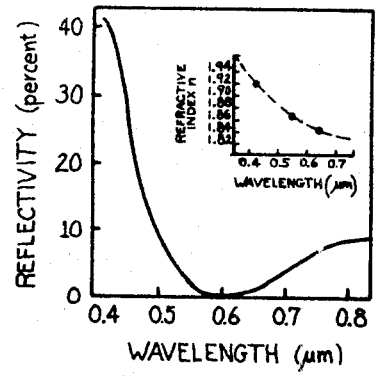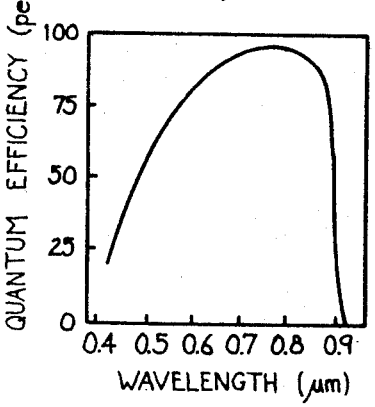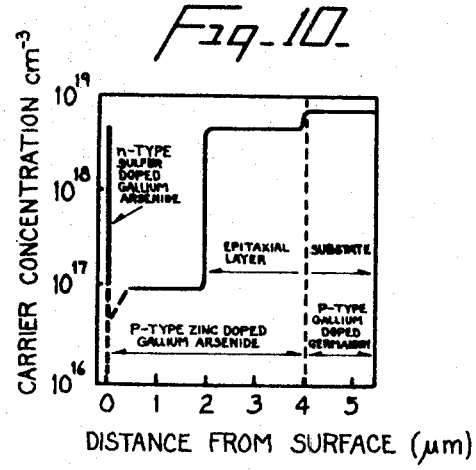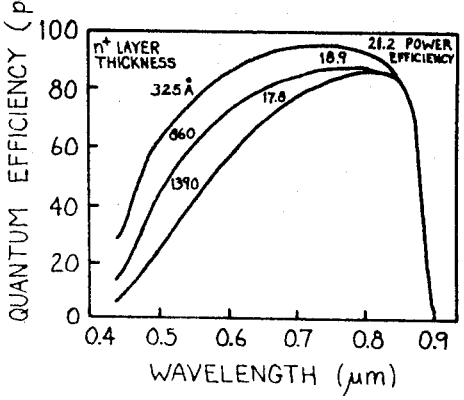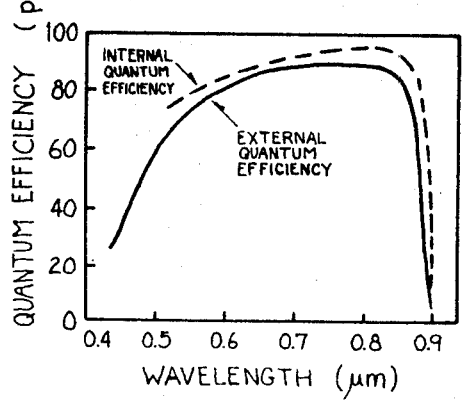

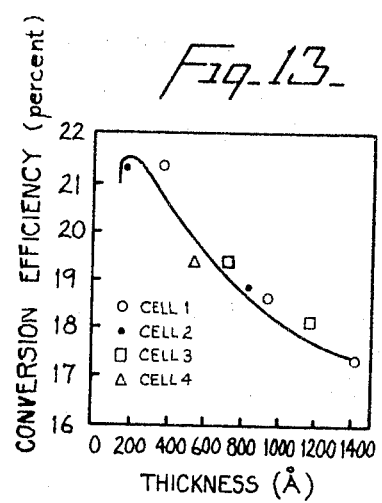
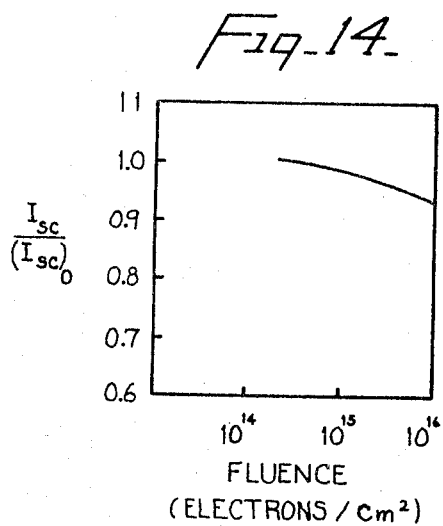
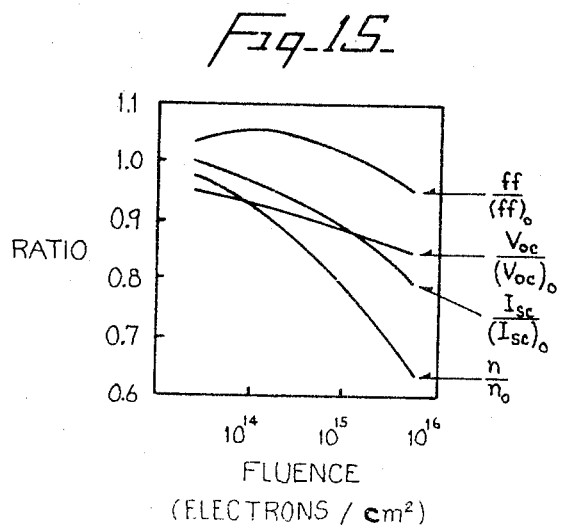

METHOD OF FORMING ELECTRICAL CONTACT AND ANTIREFLECTION LAYER ON SOLAR CELLS

DESCRIPTION

Government Support

Work relating to this invention was supported by the U.S. Air Force.

RELATED APPLICATION

This is a division of application Ser. No. 022,405, filed Mar. 21, 1979, which was a continuation-in-part of Ser. No. 889,078, filed Mar. 22, 1978, abandoned.

TECHNICAL FIELD

This invention is in the field of homojunction photovoltaic devices, including solar cells.

BACKGROUND ART

Solar cells have been developed for generating electrical energy directly from sunlight. In general, these cells can be classified as either heterojunction devices, which depend upon junctions such as those formed between two different semiconductor materials or between a metal and a semiconductor or from a metal/insulator/semiconductor sandwich, and homojunction devices which depend only upon junctions formed between layers of the same semiconductor material doped with different impurities to provide different electrical properties.

Heretofore, homojunction cells using direct-gap semiconductor materials have generally exhibited disappointing efficiencies. One reason for the relatively low efficiencies in homojunction solar cells is believed to be the high absorption coefficient which is inherent in direct gap semiconductor materials such as gallium arsenide. For example, approximately half of the carriers due to AM 1 radiation are generated within 0.2 $\mu$m of the surface of gallium arsenide. Therefore, for materials such as GaAs, which also has a high surface recombination velocity, most of the carriers generated by solar radiation recombine before they reach the junction, causing a significant decrease in conversion efficiency.

One approach which has been used to overcome this problem has been the use of a thin window layer of gallium aluminum arsenide ($Ga_{1-x}Al_xAs$) grown over the GaAs wafer by liquid phase epitaxy. Such cells may be referred to as heteroface cells. Because the recombination velocity is much less at a $Ga_{1-x}Al_xAs$/GaAs interface than at a GaAs surface, higher conversion efficiencies have been achieved. Thus, Hovel and Woodall report conversion efficiencies of up to 22% for $Ga_{1-x}Al_xAs$/GaAs heteroface solar cells but only up to 14% for GaAs homojunction solar cells for air mass 1 (AM 1) radiation. See Hovel and Woodall, J. M., 12th IEEE Photovoltaic Specialists Conf., 1976 (Institute of Electrical and Electronic Engineers, New York, 1976), p. 945.

Nevertheless, aluminum is so reactive in the vapor phase that it is difficult to prepare high quality $Ga_{1-x}Al_xAs$ layers by conventional chemical vapor deposition, which is a highly preferred fabrication method. Because of this, it has been necessary to grow $Ga_{1-x}Al_xAs_x$ layers by metal-organic chemical vapor deposition. See Dupuis, R. D., Dapkus, P. D., Yingling, R. D. and Moody, L. A., *Appl. Phys. Lett.*, 31 201 (1977). This method can be both more expensive and more time consuming than conventional chemical vapor deposition.

DISCLOSURE OF THE INVENTION

This invention relates to improved shallow-homojunction photovoltaic devices and methods for their fabrication. These shallow-homojunction devices are based upon a plurality of layers of direct gap semiconductor materials suitably doped to provide an n+/p/p+ structure. An antireflection coating is applied over the n+ top layer and the n+ top semiconductor layer is also limited to a thickness within the range which permits, upon light irradiation, significant carrier generation to occur in the p layer below the n+ top layer. Thus, the top junction is referred to as a shallow-junction.

In a particularly preferred fabrication method, the antireflection layer deposited on the n+ top semiconductor layer is formed by anodization. The anodic layer forms an excellent antireflection coating and requires no vacuum processing. Additionally, the anodization process serves to reduce the thickness of the top semiconductor layer without resulting in significant surface degradation.

Thus, homojunction solar cells can be provided which have conversion efficiencies approaching those obtainable with heteroface cells. Furthermore, the use of a $Ga_{1-x}Al_xAs$ layer is avoided which eliminates a relatively complicated and expensive step in the overall fabrication of a solar cell.

Still another significant advantage of the photovoltaic devices described herein is the ease with which ohmic contacts can be applied to them since they have high concentrations of dopants in their outer layers. This is particularly important because shallow homojunctions can have their junction qualities destroyed by attempts to form ohmic contacts at elevated temperatures. With this device, ohmic contacts can be applied by directly plating a metal layer on the semiconductor surfaces without requiring elevated temperatures so that the junction quality is preserved.

These shallow homojunction solar cells additionally possess vastly superior resistance to degradation by electron bombardment than either $Ga_{1-x}Al_xAs$ heterojunction cells or shallow homojunction GaAs cells having a p+ top layer. Because of this, the shallow homojunction cells described herein have great potential for use in space applications.

The heavily doped p+ layer additionally enables excellent solar cells to be grown on substrate materials other than the host semiconductor materials, i.e., the semiconductor material which absorbs sunlight and generates electrical current.

Gallium arsenide solar cells, according to this invention, have been grown on gallium arsenide and germanium substrates with equally outstanding efficiencies of over 20% at AM 1.

BRIEF DESCRIPTION OF THE DRAWINGS

FIG. 1 is a cross-sectional elevational view of a typical prior art solar cell employing a thin $Ga_{1-x}Al_xAs$ window;

FIG. 2 is a cross-sectional elevation view illustrating one embodiment of a solar cell according to this invention;

FIG. 3 is a cross-sectional elevation view of another embodiment of a solar cell according to this invention;

FIGS. 4(a) and 4(b) are schematic illustrations of the application of gold contacts to a solar cell of this invention;

FIG. 5(a) and 5(b) are schematic illustrations of the application of tin contacts to a solar cell of this invention;

FIG. 6 is an exploded cross-sectional view illustrating the area around one contact finger of a solar cell fabricated according to this invention;

FIG. 7 is a plot of data illustrating the quantum efficiency at varying wavelengths for a solar cell fabricated according to this invention;

FIG. 8 is a plot comparing measured reflectivity to theoretical reflectivity for an anodic antireflection layer applied to a GaAs shallow-homojunction device according to this invention;

FIG. 9 is a plot of data illustrating the quantum efficiency at varying wavelengths for a solar cell of this invention having an anodic antireflection coating;

FIG. 10 is a graphical presentation of the impurity profile for a GaAs shallow-homojunction photovoltaic device of this invention grown on a germanium substrate;

FIG. 11 is a plot of data illustrating the spectral response of a GaAs solar cell of this invention having an $n+$ layer thinned by an anodization-strip cycle;

FIG. 12 is a plot of data for the spectral response of a GaAs solar cell of this invention and comparing internal and external quantum efficiency;

FIG. 13 is a plot of data illustrating the power conversion efficiency as a function of $n+$ layer thickness for four GaAs solar cells of this invention;

FIG. 14 is a plot of data illustrating the decrease in $I_{sc}$ with increasing electron irradiation fluences for a GaAs shallow-homojunction solar cell of this invention;

FIG. 15 is a plot of data illustrating the decrease in $I_{sc}$, $V_{oc}$, fill factor and power conversion efficiency with increasing electron irradiation fluences for another GaAs shallow-homojunction solar cell of this invention.

BEST MODE OF CARRYING OUT THE INVENTION

The invention will now be further described with particular reference to the Figures.

A prior art homojunction photovoltaic device 10 is illustrated in FIG. 1. The substrate 12 is formed from an n GaAs wafer. Typically, substrate 12 might be doped to a carrier concentration of $10^{16}$–$10^{17}$ carriers/cm$^3$. Layer 14 is formed over layer 12 and comprises p GaAs. Layer 16 is formed from $p+$ Ga$_{l-x}$Al$_x$As and might have a carrier concentration of $10^{18}$ carriers/cm$^3$. A typical thickness for layer 16 is less than one micrometer. This Ga$_{l-x}$Al$_x$As window has been used because the recombination velocity for carriers generated upon solar illumination is much less at the Ga$_{l-x}$Al$_x$As/GaAs interface than it is within GaAs itself. In practice, a device of FIG. 1 can be formed by depositing a thin layer 16 of $p+$ Ga$_{l-x}$Al$_x$As over an n-GaAs substrate and subsequently diffusing some of the p-dopants from the Ga$_{l-x}$Al$_x$As layer into the GaAs substrate to form layer 14.

Unfortunately, Ga$_{l-x}$Al$_x$As coatings are difficult to apply using chemical vapor deposition and are relatively difficult to use in the formation of an ohmic contact. Because of this, ohmic contacts are typically applied to devices such as that shown in FIG. 1 by employing vacuum coating techniques followed by alloying. These techniques are relatively expensive and detrimental to shallow-homojunctions.

FIG. 2 illustrates one embodiment of an improved photovoltaic device of this invention. Therein, substrate 22 is formed from a wafer of $p+$ GaAs. Substrate 22 might be formed, for example, from GaAs suitably doped with p-dopants such as zinc, cadmium, beryllium or magnesium to a carrier concentration of at least about $10^{18}$ carriers/cm$^3$. The thickness is not critical for substrate 22, but might be between about 1 and about 500 μm. Layer 24 is formed on the upper surface of layer 22 and is a layer of GaAs suitably doped with p-dopants to a carrier concentration of about $10^{14}$–$10^{18}$ carriers/cm$^3$. The thickness of layer 24 depends upon the minority carrier diffusion length and absorption coefficient, with a typical range for GaAs of from about 1 to about 5 μm.

Layer 26, formed from $n+$ GaAs, is epitaxially deposited upon layer 24. Layer 26 may be formed from GaAs suitably doped with n-dopants, such as sulphur, selenium or silicon to a carrier concentration of at least about $10^{17}$ carriers/cm$^3$. It is critical to limit the thickness of layer 26 to one which allows significant carrier generation within layer 24. Thus, layer 26 would typically be limited to a maximum thickness of 1500 Å, and preferably less.

Great care is necessary to assure that such thin layers are uniform, and not all deposition techniques are suitable. The techniques believed to be suitable include chemical vapor deposition, molecular beam epitaxy, liquid phase epitaxy and ion beam implantation. In addition, if care is taken to dope the top layer 26 to a sufficiently high concentration, an ohmic contact can be formed on the surface without degrading junction characteristics.

It has been found that the $n+/p/p+$ structure has significant advantages over previously employed structures. The $p+$ layer, for example, forms a back surface field junction with the p layer to provide high efficiency current collection. The high doping level in the $p+$ layer also simplifies the application of an ohmic contact thereto and this high doping level also allows the shallow-homojunction cell to be formed on a different substrate material which reduces the cost or provides other advantages. In this regard, the heavily doped $p+$ layer allows tunneling between any heterojunction formed between dissimilar materials thereby making ohmic contact feasible.

The $n+$ top layer reduces the series resistance of solar cells having this structure. It also simplifies the formation of an ohmic contact to the cell because of its high doping level.

The p layer also provides a major advantage in the $n+/p/p+$ structure. Greater cell efficiencies are possible with this structure compared to other shallow homojunction structures, such as $p+/n$, because of the greatly increased diffusion length of minority carriers, i.e., electrons, in a p layer compared to the diffusion length of minority carriers in an n layer, i.e., holes.

The overall cell structure of $n+/p/p+$ thus provides a shallow-homojunction device which can be manufactured inexpensively, is capable of providing high efficiencies, can be deposited on substrates formed from different materials, and has outstanding resistance to degradation by electron bombardment, which is a severe problem encountered in space applications.

Top layer 28 is an antireflection coating which reduces the reflection of GaAs and thus increases absorption of solar energy. The antireflection coating might be, for example, successive layers of transparent materials having relatively high and relatively low indices of refraction, respectively. For example, an antireflection coating might be prepared by electron-beam evaporation of titanium dioxide and magnesium fluoride.

It is particularly preferred to apply the antireflection coating by anodization. Application of anodic coatings can be done without any vacuum processing and is an inexpensive way of producing excellent antireflection coatings. In addition, the application of an anodic layer necessarily reduces the thickness of the top GaAs layer. For example, it has been found that application of an anodic layer typically reduces the thickness of the GaAs layer at the rate of about ⅔ part of the volume of GaAs to one part by volume of anodic layer. Typically, the thickness of the antireflection layer would be based upon quarterwave theory.

Anodic coatings can be formed by employing the device as the anode in an electrolytic cell. By proper selection and control over the cell parameters, including the electrolyte and voltage applied, thin uniform anodic coatings can be formed. Suitable electrolytes are well known and a specific one found to be suitable is a solution formed by mixing 3 grams of tartaric acid into 100 ml of water, adding sufficient $NH_4OH$ to adjust the pH to about 6.2, and then adding 250 ml of propylene glycol. The voltage applied should be sufficient to produce the anodic coating in the thickness desired.

Although the description above has been limited to GaAs cells, other direct bandgap semiconductors such as InP and CdTe are also suitable. Additionally, the direct bandgap semiconductor layers can be deposited on substrates formed from different materials.

FIG. 3 illustrates a shallow-homojunction device 30 formed on p+ germanium substrate 32. The thickness of substrate 32 might be from 0.1 μm to 500 μm and it might be formed from single crystal Ge doped with p-dopants to a carrier level of $10^{18}$ carriers/cm$^3$ or greater. GaAs layers are then applied to Ge substrate 32, by chemical vapor deposition or other techniques, to form the desired shallow-homojunction device from p+ GaAs layer 22, p GaAs layer 24 and thin n+ GaAs layer 26, which are similar to layers 22, 24 and 26, respectively, in FIG. 2. Antireflection coating 28 is subsequently applied over thin n+ GaAs layer 26 to complete this embodiment.

There is a major cost advantage possible in the manufacture of GaAs shallow-homojunction solar cells when the actual gallium arsenide employed can be minimized by depositing the cell on a substrate of less costly material, such as germanium or silicon. Gallium arsenide solar cells theoretically have higher conversion efficiencies than cells formed from indirect bandgap materials, such as silicon and germanium. In addition, gallium arsenide cells potentially should be more radiation resistant in space environments. By growing gallium arsenide cells on materials such as silicon or germanium, which have lower costs, the advantages of both types of materials can be achieved.

Substrates formed from materials different from the host semiconductor can offer other advantages in addition to cost advantages. Germanium, for example, has higher thermal conductivity than GaAs, which is an advantage in heat dissipation. Germanium also has a lower melting point and lower vapor pressure than GaAs, which might allow easier laser crystallization on a substrate such as graphite. Laser crystallized germanium having large grains would provide a good substrate for chemical vapor deposition of GaAs.

The use of substrates which are different from the host semiconductor is possible because of the heavy doping of the substrate and the p+ layer of the device. This permits tunneling to occur around the heterojunction between the substrate and p+ layer so that it does not act as a barrier. Thus, a good ohmic contact can be formed.

It should be understood that the embodiment shown in FIG. 3 is still considered to be a homojunction cell, even though it technically contains a boundary between dissimilar materials, namely the boundary between p+ Ge substrate 32 and p+ GaAs layer 22. Although this boundary might technically be referred to as a heterojunction, the heavy doping allows ohmic contact. This should be contrasted with the heteroface between p GaAs layer 14 and thin p+ $Ga_{1-x}Al_xAs$ layer 16 in FIG. 1, which serves the function of reducing surface recombination velocity of carriers generated in layer 14 upon solar irradiation. It should also be contrasted with a typical heterojunction between dissimilar materials which is used to create a barrier to current flow in heterojunction devices. Because of these differences in purpose, solar cell 30 illustrated in FIG. 3, and other similar cells, will be referred to herein as shallow-homojunction solar cells formed from direct gap semiconductors deposited on different substrate materials.

Although substrate 32 has been illustrated to be single crystal Ge, other substrates could be employed. Single crystal silicon, for example, could also be employed. In fact, substrate 32 might also be formed from polycrystalline or amorphous materials, including silicon and germanium.

Electrical contact to the thin n+ layer can be easily made because of the high doping level therein. Contacts can be formed by electroplating metals such as gold, tin, etc. Specific procedures for the electroplating of these metals differ, however, and are respectively illustrated in FIGS. 4 and 5. In both of these figures, the shallow-homojunction solar cell has the structure illustrated in FIG. 3.

In FIGS. 4(a) and 4(b), a typical application of gold contacts is illustrated. In this technique, the thin n+ layer 26 is first anodized to form anodic coating 28 while simultaneously thinning n+ layer 26.

The anodization potential can be set to achieve the appropriate thickness for the antireflection coating and n+ layer. A photoresist mask 30 is then placed over anodic coating 28 and finger openings 32 (FIG. 4[a]) are etched through anodic coating 28 employing an etch such as dilute hydrochloric acid. Gold contacts 34 are then electroplated onto n+ layer 26 through photoresist mask 30. Photoresist mask 30 is then removed by dissolving it in acetone to produce the device of FIG. 4(b).

The application of tin contacts is illustrated in FIGS. 5(a) and 5(b). Photoresist mask 30 is directly applied to thin n+ layer 26 and tin contacts 36 are electroplated onto layer 26 through mask 30 (FIG. 5[a]). Photoresist mask 30 is then removed and the thin n+ layer 26 is anodized (FIG. 5 [b]). When this procedure is employed, the thin n+ layer 26 remains thicker under tin contacts 36 than under the remainder of anodic coating 28. Thus, layer 26 has raised shoulders 38 directly beneath tin contacts 36 as can be seen in FIG. 5(b). Thus, there is a larger separation between the metal contacts and the p-n junction for tin contacts than for gold contacts. Because the n+ layer is extremely thin after anodization, this increased separation should improve device yield and reliability.

The use of tin contacts is also advantageous for optimizing the n+ layer thickness since the anodic oxide formed on gallium arsenide can be stripped with dilute HCl and the cell reanodized without removing the contacts. Because the thickness of the oxide layer is very uniform and easily controlled by adjusting the anodizing voltage, a series of alternating anodization and stripping steps can therefore be used for controlled reduction of n+ layer thickness. The thickness of the gallium arsenide removed during each anodization can be accurately determined by using elliposometry to measure the anodic oxide thickness and multiplying this value by an appropriate factor.

Some anodic antireflection coatings may be somewhat unstable in harsh environments. If this is a problem, it can be overcome by application of a thin (e.g., 100 Å), transparent, protective coating of a material such as $SiO_2$ or phosphosilicate glass. Such protective coatings can be applied by pyrolytic deposition techniques.

FIG. 6 is a cross-sectional view illustrating one finger of a solar cell having such a protective $SiO_2$ coating 40. Device fabrication is similar to that described above for FIGS. 4(a) and 4(b), except that a hydrofluoric acid etch is employed prior to the hydrochloric acid etch. Contact finger 34 can be formed from gold plated to a thickness of about 4 $\mu$m. The back contact 42 can also be formed from plated gold. Although the $SiO_2$ protective layer was described as being applied prior to contact formation, it could also be applied after the contacts have been formed.

As those skilled in the art will recognize, other metals could be used in place of gold and tin for purposes of establishing electrical contact with the photovoltaic device which is described herein. In devices fabricated as illustrated in FIG. 4, any metal could be employed including gold, silver, platinum, tin, aluminum, copper, etc. In devices fabricated as illustrated in FIG. 5, those metals can be used which form a sufficiently thick oxide layer during anodization such that current leakage through metal contacts is reduced enough to allow the semiconductor surface to be anodized. Tin, aluminum and copper are examples.

Devices of this invention have at least one n-p homojunction and at least one other junction sufficient to increase current collection. This other junction requires an impurity profile wherein the majority carriers all have the same charge and wherein an electrical field is created by the impurity profile which aids in collecting minority carriers. The p+ layer also allows the use of substrate materials other than the host semiconductor material. Specific examples of suitable junctions include high/low homojunctions and graded profile junctions where the impurity doping level increases with distance from the n-p junction.

This invention can be further specifically illustrated by the following Examples.

EXAMPLE 1

Gallium Arsenide Shallow-Homojunction Photovoltaic Device

GaAs layers were grown in an $AsCl_3$-Ga-$H_2$ system. The reactor tube had an inner diameter of 55 mm, and the $H_2$ flow through the $AsCl_3$ evaporator and over the Ga boat was in the range 300–500 $cm^3$/min. The p and n dopants were introduced in the vapor phase by using $(C_2H_5)_2Zn$ and $H_2S$, respectively. The reactor tube was vertical, allowing rotation of the substrate, which resulted in greater doping uniformity in the layers. Use of high purge flows allowed the reactor tube to be opened at the bottom to load and unload substrates without losing the $H_2$ atmosphere inside the tube. Thus, the furnace could remain at growth temperature during the loading procedure, decreasing the cycle time between runs. Once inside the reactor tube, the substrate could be preheated in pure $H_2$ just before being introduced into the reactant gas flow at the growth position. For a more detailed description, see Bozler, C. O., *Solid State Research Report*, 2, 52, Lincoln Laboratories, M.I.T. (1975).

A p layer, 1.7 $\mu$m thick, was first grown on a p+, Zn-doped (100)-oriented GaAs substrate with a carrier concentration of $10^{18}$ carriers/$cm^3$, followed by a thin n+ layer. The p layer (p$\sim 10^{16}$ $cm^{-3}$) and n+ layer (n$\sim 4 \times 10^{18}$ $cm^{-3}$) were doped with Zn and S, respectively, by using $(C_2H_5)_2Zn$ and $H_2S$ sources. The sheet resistance of the n+ layer was 70$\Omega$/□. To determine the thickness of this layer, the I-V characteristic between two ohmic contacts to the layer was measured while a channel was being etched between the contacts. When the I-V characteristic for back-to-back diodes was observed, etching was immediately stopped, and the channel depth was measured with a profilometer. The n+ layer thickness measured by this technique was 1300A°.

The initial fabrication step following layer growth was the pyrolytic deposition of $SiO_2$ glass (1000 Å) on the GaAs wafer at 400° C., in order to protect the n+ layer during the succeeding steps. Openings for ohmic contact fingers were etched in the glass coating using photolithographic techniques. There were 10 openings, 0.5 cm long and 12 $\mu$m wide, spaced 1 mm apart. The wafer was sputter-etched to remove GaAs to a depth of 40 Å in the finger openings, then sputter-coated with successive layers of Au-12% Ge (300 Å) and Au (2000 Å). The Au/AuGe film was defined photolithographically into 25-$\mu$m-wide fingers, interconnected at one end, that overlaid the openings in the glass. All of the photolithographic steps were carried out with standard equipment used for silicon wafer processing. The wafer was then annealed under flowing $N_2$ for one second at 300° C. on a graphite heater strip to establish ohmic contact between the AuGe fingers and the n+ layer, as verified by measurements of test contacts on the wafer. The conventional technique of alloying at 450° C. was not used because it was found to cause penetration of the n+ layer, and subsequent destruction of the homojunction.

The contact fingers to the n+ layer were electroplated with Au to a thickness of 4 $\mu$m. The back contact to the p+ substrate was made with sputtered Au. The active area of the cell was defined by etching a 1 cm $\times$ 0.5 cm rectangular mesa in the GaAs, and the glass layer was removed with buffered HF. The fingers of the cell at this stage had a cross sectional configuration similar to that illustrated in FIG. 6, except that there was no anodic layer 28. Finally, the cell was antireflection-coated with successive layers of SiO (700 Å) and $MgF_2$ (1200 Å) formed by electron beam evaporation. For GaAs with this two-layer coating, the average reflectivity measured over the 0.5–0.9 $\mu$m wavelength band was less than 5%.

An efficiency measurement of the cell was made by using a high-pressure Xe lamp with a water filter as a simulated AM 1 solar source. The incident intensity was adjusted to 100 mW/cm$^2$, using a NASA standard Si solar cell, calibrated for AM 1, as a reference. The open-circuit voltage was 0.91 V, the short-circuit current 10.3 mA, and the fill factor 0.82, giving a measured conversion efficiency of 15.3%. When the contact area is subtracted, the corrected efficiency is 17%. The n factor at 100 mA/cm$^2$ is 1.25, as obtained from the dark I-V characteristic, indicating good material quality with long carrier diffusion lengths. The series resistance is 0.5Ω.

The quantum efficiency of this cell as a function of wavelength is shown in FIG. 7, and, as can be seen, quantum efficiency is highest at the longer wavelengths, with a gradual decrease at shorter wavelengths.

This cell was fabricated by sputtering and alloying techniques, which although possible because of the relatively thick n+ layer, are not preferred.

EXAMPLE 2

Gallium Arsenide Shallow-Homojunction Photovoltaic Device Having Anodic Antireflection Coating A photovoltaic device was prepared as in Example 1 except that the antireflection coating was an anodic coating, and all ohmic contacts were electroplated.

The GaAs layer used was grown in an AsCl$_3$-Ga-H$_2$ CVD system on p+ Zn-doped (100)-oriented substrate with a carrier concentration of 10$^{18}$ cm$^{-3}$. A p layer about 2 μm thick was first grown on the substrate followed by an n+ layer (n~5×10$^{18}$ cm$^{-3}$) were doped with Zn and S, respectively, by using (C$_2$H$_5$)$_2$Zn and H$_2$S sources. Following GaAs growth, the n+ layer was anodically oxidized as follows.

The electrolyte solution used for anodization was prepared by mixing 3 g of tartaric acid with 100 ml of H$_2$O, adding sufficient NH$_4$OH to adjust the pH to about 6.2, and then adding 250 ml of propylene glycol. The final pH was 4.6–5.8. Anodization of the GaAs was performed at room temperature, using a platinum wire as cathode. A smooth anodic layer of uniform thickness was obtained by using a constant current source with a voltage limiter. The source was set at a current corresponding to a current density of about 750 μA/cm$^2$ for the GaAs anode, and the maximum output voltage was set at about 43 V. The current initially remained constant until the voltage increased to its limiting value, after which the voltage remained constant and the current decreased. Anodization was terminated when the current fell to one-tenth of its initial value. The thickness (measured by ellipsometry using a He-Ne laser) of the anodic layer was about 20 Å/V and did not depend strongly on current density. The layer produced took less than 5 minutes, was about 850 Å thick, and consumed about 550 Å of the GaAs layer. The anodic layer was stable up to at least 250° C. in air. The optical constants were measured by ellipsomtery at 4358 and 5461 Å using a Hg lamp and at 6328 Å using a He-Ne laser. The values of the refractive index n at these wavelengths are 1.91, 1.85 and 1.83 respectively, as shown in the inset of FIG. 8. The values of extinction coefficient k are very low, and for the thickness of anodic layers used, absorption of the optical constants (and the effectiveness of the antireflection coating) is illustrated in FIG. 8 by the close agreement between the measured reflectivity spectrum of an 800 Å thick anodic layer on GaAs and the value for this structure calculated using values of n obtained from the curve shown in the inset of FIG. 8, k=0 for the anodic layer, and bulk optical constants for GaAs.

A layer of Au about 3 μm thick was then electroplated on the p+ substrate as the back contact. Photoresist AZ 1350J was spun on the anodic layer, and photolithographic techniques were used to etch openings for ohmic contact fingers in the anodic layer. (The anodic layer dissolves readily in AZ photoresist developer, as well as in HCl.) There were 10 openings, 0.5 cm long and 12 μm wide, spaced 1 mm apart and interconnected with a bar at one end. A layer of Au about 3 μm thick was then electroplated into the openings, and the wafer was annealed in N$_2$ for 1 sec at 300° C. on a graphite heater strip to produce ohmic contact between the Au fingers and the n+ layers. Finally, the active area of the cell was defined by etching the GaAs to form a 1-cm×0.5 cm rectangular mesa.

Efficiency measurements, using a high-pressure Xe lamp with a water filter as a simulated AM 1 source, were made. The incident intensity was adjusted to 100 mW/cm$^2$, using a NASA-measured GaAs solar cell as a reference. The cell was also measured on the roof of the laboratory at an ambient temperature of about 20° C. The solar flux density measured with a pyranometer was 98 mW/cm$^2$, close to AM 1 conditions. The open-circuit voltage was found to be 0.97 V, the short-circuit current 25.6 mA/cm$^2$, and the fill factor 0.81, giving a measured conversion efficiency of 20.5 percent, without correcting for the area of the contact fingers. The quantum efficiency of this cell as a function of wavelength is shown in FIG. 9. The quantum efficiency exceeds 90 percent at the maximum, but it decreases quite strongly at shorter wavelengths.

EXAMPLE 3

Gallium Arsenide Shallow-Homojunction Photovoltaic Devices on Germanium Substrates The growth procedures and apparatus of Example 1 were used, except as noted. The Ge substrates were oriented (100) 2° off toward (110) and were prepared by coating them with SiO$_2$ on the backside to reduce Ge autodoping of the GaAs layers during growth. The electron concentration in nominally undoped layers deposited on these coated substrates was 5×10$^{15}$ cm$^{-3}$. The lattice constants and expansion coefficients of Ge and GaAs are well matched, a favorable condition for obtaining good quality epitaxial layers.

The doping profile used for the solar cells is shown in FIG. 10. The p+ Ge substrate was highly doped with Ga (8×10$^{18}$ cm$^{-3}$) in order to overdope any As that might diffuse into the Ge during the deposition of the GaAs and to assure tunneling through any thin barriers which could arise at the heterojunction interface. The p+ GaAs buffer layer was highly doped with Zn, again to assure tunneling and also to overdope Ge diffusing into the GaAs during growth. The change in hole concentration from 5×10$^{18}$ cm$^{-3}$ in the buffer layer to 1×10$^{17}$ cm$^{-3}$ in the active layer provided a back surface field to increase the collection efficiency. The n+ layer was doped to a carrier concentration of 5×10$^{18}$ cm$^{-3}$ with sulfur, had a sheet resistivity in the range 45–100Ω/□, and its electron mobility was ~1000 cm$^2$/V-sec.

An AR coating was produced on the n+ layer by anodic oxidation, which consumed a thickness of GaAs equal to 0.66 times the thickness of oxide produced. The anodizing solution was prepared by adding 3 g tartaric acid to 100 ml H$_2$O, adjusting the pH to 6.2 with NH$_4$OH, and adding 250 ml propylene glycol. The thickness of the oxide layer was proportional to the limiting voltage used for anodization. The thickness required for an optimum AR coating was 850 Å, which was obtained for a limiting voltage of 43 V.

Contact to the very thin n+ layer was made easily because of its high doping level. Electroplated Au formed ohmic contacts with a specific resistance of $8 \times 10^{-5}$ Ω−cm$^2$. Electroplated Sn also formed ohmic contacts, although their resistance was not measured. Sn had the advantage that in the solution used for GaAs anodization, Sn was also anodized, forming an oxide resistive enough to allow the GaAs to be anodized in the presence of Sn contacts.

Two different fabrication procedures were used for cells with Au and Sn contact fingers, as illustrated in FIGS. 4 and 5. For devices with Au contacts, the n+ layer was anodized first, finger openings were etched through the oxide using a photoresist mask, and Au was plated using the same mask. For cells with Sn contacts the Sn fingers were plated first, using a photoresist mask, the photoresist was then removed, and the n+ layer was anodized. With this procedure the n+ layer was thicker under the Sn contacts than under the anodic oxide, so that there was a larger separation of the metal from the p-n junction than with Au contacts. Because the n+ layer is so thin, the increased separation was believed to be better for device yield and reliability.

A mesa etch of the GaAs was used to define the active area of the cells, and the back contact to the Ge substrate was made by Au plating. No alloying or vacuum processing was used in cell fabrication.

Measurements of spectral response as a function of n+ layer thickness were made on small cells, 0.05 cm$^2$ in area, having two Sn contact fingers 0.5 mm apart connected to a Sn bar at one end. The n+ layer, which was initially 2000 Å thick with a sheet resistance of 45 Ω/□, was thinned by alternate anodization and stripping. The external quantum efficiency, which is the ratio of the number of carriers collected ($I_{sc}/q$) to the number of incident photons, was measured after each of three anodizations at 43 V, so that the cells were antireflection-coated during each measurement. The values of $I_{sc}$ and incident photon flux were measured as a function of wavelength in a spectrometer which was arranged so that all the light fell between the two contact fingers. The results for cell 1 are given in FIG. 11, which shows that thinning the n+ layer results in a marked improvement in quantum efficiency, especially at shorter wavelengths. This is expected because of the high absorption coefficients for GaAs ($10^4$–$10^5$ cm$^{-1}$), which increase with decreasing wavelength, and the high surface recombination velocity, which is believed to be around $10^7$ cm/sec. The power conversion efficiency for each n+ layer thickness is also given in FIG. 11. These values were measured with the cell fully illuminated by a simulated AM1 source, with no correction made for the finger area.

FIG. 12 shows the final spectral response of cell 2, which was fabricated next to cell 1. The n+ layer was slightly thinner than that of cell 1, and the response was therefore slightly improved at the short wavelengths. The curve for internal quantum efficiency, which is the ratio of $I_{sc}/q$ to the rate at which photons enter the semiconductor, was obtained from the measured external efficiency by correcting for the spectral reflectivity of the AR-coated cell. This curve indicates that the cell design is very near the optimum.

The AM1 power efficiencies of cells 1 and 2 and two other small cells fabricated side by side on the same wafer are plotted in FIG. 13 as a function of n+ layer thickness. In order to obtain additional thickness values, cells 2, 3 and 4 were first anodized to 10, 20 and 30 V, respectively, after which the oxide was stripped. All 4 cells were then anodized together to 43 V to provide an AR coating, stripped, anodized to 43 V, stripped again and once more anodized to 43 V. Efficiency measurements were made after each 43 V anodization. After the third such anodization, the efficiency of cell 3 had dropped to 10% while cell 4 had essentially no sensitivity to light.

Assuming that the cell output drops to zero when removal of the n+ layer is completed, for cells 1–4 complete removal would occur at a total anodization voltage between 149 and 159 V, the final values for cells 3 and 4, respectively. It was assumed for the purpose of plotting the data that complete removal would occur at 154 V. Using the removal rate of 13.3 Å/V, the initial n+ layer thickness was found to be 2050 Å. To obtain the thickness of the n+ layer remaining after each successive anodization the total thickness removed was calculated from the sum of the voltages used to that point and subtracted from the initial thickness. The thickness values given in FIGS. 11 and 12, as well as those of FIG. 13, were obtained in this manner. For all the points in FIG. 13 the fill factor was 0.82 and $V_{oc}$ was 0.97 V. As the thickness of the n+ layer is reduced below 200 Å thick, the efficiency drops precipitously from the maximum value of 21.2%.

Seven larger cells, 1 cm×0.49 cm, were made from three different wafers. Either Au or Sn was used for the contact finger pattern, which consisted of 20 fingers 0.5 cm apart with a connecting bar at one end. The fingers covered 4% of the total area. One cell with Au contacts was partially shorted and one with Sn contacts was thinned too much. Power efficiency measurements, using a high pressure Xe lamp with a wafer filter as a simulated AM1 source, were made on the other five cells. The incident intensity was adjusted to 100 mW/cm$^2$ using a NASA-measured GaAs solar cell as a reference. Table 1 lists the measured values of $V_{oc}$, $I_{sc}$, fill factor and efficiency, as well as the initial sheet resistance and the total anodization voltage. Independent measurements as NASA Lewis Research Center have confirmed these results. The sheet resistance value gives some indication of the initial thickness of the n+ layer; a value of 100 Ω/□ corresponds to approximately 1200 Å. The total anodization voltage is the sum of the limiting voltages used in a series of anodization-strip steps where the thining ratio is 20 Å/V. For each cell the final anodization was carried out at 43 V to provide the AR coating. The conversion efficiency values, not corrected for contact areas, are all in the 17–20% range.

TABLE 1

| CELL NO. | CVD WAFER NO. | CONTACT METAL | INITIAL SHEET RESISTANCE ($\Omega/\square$) | TOTAL ANODIZATION VOLTAGE | AM1 $V_{OC}$ (volts) | AM1 $I_{SC}$ (mA) | AM1 FILL FACTOR | AM1 EFFICIENCY (%) |
|---|---|---|---|---|---|---|---|---|
| 1 | 13 | Au | 102 | 63  | 0.99 | 12.0 | 0.82 | 20 |
| 2 | 11 | Au | 65  | 96  | 0.99 | 11.4 | 0.83 | 19 |
| 3 | 9  | Sn | 62  | 86  | 0.97 | 10.9 | 0.79 | 17 |
| 4 | 11 | Sn | 65  | 106 | 0.99 | 11.8 | 0.75 | 18 |
| 5 | 11 | Sn | 65  | 116 | 0.99 | 11.9 | 0.79 | 18 |

EXAMPLE 4

Electron Bombardment of GaAs Shallow-Homojunction Solar Cells

It has been reported that irradiation of $Ga_{1-x}Al_xAs$/GaAs heteroface solar cells with electrons causes the conversion efficiencies of these cells to be dramatically decreased. This is believed to be partly because of the diffusion lengths of minority carriers in p and n layers decrease with increasing electron irradiation, and partly because the surface recombination velocity at the $Ga_{1-x}Al_xAs$/GaAs interface increases with increasing electron irradiation. It was hypothesized that the $n^+/p/p^+$ structure of the cells described herein would dramatically increase the resistance to cell degradation under electron irradiation. If so, the $n^+/p/p^+$ GaAs shallow-homojunction solar cells would be outstanding candidates for space applications, involving space vehicles, solar powered satellites, etc.

To test the hypothesis, a series of experiments was run in which shallow-homojunction GaAs solar cells, as described herein, were irradiated with 1 MeV electrons from electron fluences ranging from $10^{14}$ to $10^{16}$ electrons/cm$^2$. The $10^{16}$ electron/cm$^2$ fluence is equivalent to dosages which electronic devices would be subjected to in over 50 years in synchronous orbit.

In one experiment, a GaAs shallow-homojunction solar cell prepared according to Example 1 and having a thin n$^+$ layer of about 1000 Å without an antireflection coating thereon was subjected to electron fluences of 0, $8 \times 10^{14}$, $3.2 \times 10^{15}$ and $1.0 \times 10^{16}$ electron/cm$^2$. The change in the short circuit current, $I_{sc}$, caused by these electron fluences was determined by integrating the quantum efficiencies with the solar spectrum at air mass 0 (AM 0), which is representative of space conditions. FIG. 14 is a plot of $I_{sc}/(I_{sc})^\circ$ where $(I_{sc})^\circ$ is the original short circuit current before electron bombardment. As can be seen, at a fluence of $1 \times 10^{16}$ electron/cm$^2$, the decrease in $I_{sc}$ was only about 7%. The corresponding $Ga_{1-x}Al_xAs$/GaAs cell is reported in the literature to undergo a 99% decrease in $I_{sc}$ under a corresponding electron fluence. See Walker, C. E., Byvik, C. E., Conway, E. J., Heinbockel, J. H., and Doviak, M. J., "Analytical and Experimental Study of 1 MeV Electron Irradiated GaAlAs/GaAs Heteroface Solar Cells," *J. Electrochem. Soc.: Solid-State Science and Technology*, 2034–36 (1978).

FIG. 15 illustrates corresponding data for a GaAs shallow-homojunction solar cell having a thin n$^+$ layer of about 1400 Å with an anodic AR coating under electron fluences ranging from $5 \times 10^{13}$ to $7 \times 10^{15}$ electron/cm$^2$. The cell was also measured under simulated AM 0 conditions at the above range of dosages. As can be seen from FIG. 15 where items having the subscript $^\circ$ indicate values prior to electron bombardment, short circuit current ($I_{sc}$) decreased by about 20% at $7 \times 10^{15}$ electron/cm$^2$, and the open circuit voltage, $V_{oc}$, also decreased gradually. The fill factor, ff, actually increased slightly before it began to decrease with increasing fluences. The conversion efficiency n of the cell, which was about 14% at AM 0 before electron irradiation, still had over 60% of its original efficiency after being bombarded with $7 \times 10^{15}$ electrons/cm$^2$.

INDUSTRIAL APPLICABILITY

This invention has industrial applicability in the fabrication of solar cells, particularly solar cells for use in space applications.

EQUIVALENTS

Those skilled in the art will recognize, or be able to ascertain using no more than routine experimentation, many equivalents to the specific embodiments of the invention described herein. Such equivalents are intended to be encompassed by the following claims.

We claim:

1. A method of applying an electrical contact and an anodic antireflection coating to an n$^+$ layer of a direct gap semiconductor device, comprising:
   a. applying a metal contact to said n$^+$ layer, said metal being anodizable; and, thereafter
   b. anodizing said n$^+$ layer whereby its thickness is reduced and an antireflection layer is formed thereover.

2. A method of claim 1 wherein said anodizable metal comprises tin.

* * * * *